(12) United States Patent
Goh et al.

(10) Patent No.: US 10,643,983 B2
(45) Date of Patent: May 5, 2020

(54) EXTENDED STIFFENER FOR PLATFORM MINIATURIZATION

(71) Applicant: Intel Corporation, Santa Clara, CA (US)

(72) Inventors: Eng Huat Goh, Ayer Itam (MY); Bok Eng Cheah, Gelugor (MY); Jackson Chung Peng Kong, Penang (MY); Min Suet Lim, Penang (MY); Khang Choong Yong, Puchong (MY); Howe Yin Loo, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/996,302

(22) Filed: Jun. 1, 2018

(65) Prior Publication Data

US 2019/0013303 A1 Jan. 10, 2019

(30) Foreign Application Priority Data

Jul. 4, 2017 (MY) .......................... PI 2017702439

(51) Int. Cl.
*H01L 25/16* (2006.01)
*H01L 23/64* (2006.01)
(Continued)

(52) U.S. Cl.
CPC ............ *H01L 25/162* (2013.01); *H01L 21/50* (2013.01); *H01L 23/16* (2013.01);
(Continued)

(58) Field of Classification Search
CPC ..... H01L 25/162; H01L 28/40; H01L 23/562; H01L 23/49838; H01L 21/50; H01L 23/647; H01L 23/16; H01L 23/642; H01L 2924/15192; H01L 23/3128; H01L 24/16; H01L 2924/19105; H01L 2924/15311;
(Continued)

(56) References Cited

U.S. PATENT DOCUMENTS 6,570,250 B1* 5/2003 Pommer ............. H01L 25/0655
257/704
2003/0000736 A1* 1/2003 Sathe ................ H01L 23/49811
174/255
(Continued)

*Primary Examiner* — Benjamin T Liu
(74) *Attorney, Agent, or Firm* — Schwabe, Williamson & Wyatt, P.C.

(57) ABSTRACT

Embodiments of the present disclosure describe integrated circuit (IC) package assemblies having a stiffener that extends beyond a package substrate outer edge, computing devices incorporating the IC package assemblies, methods for formation of the IC package assemblies, and associated configurations. An IC package assembly may include a package substrate having a first side, a second side opposite the first side, and an outer edge extending between the first side and the second side; an IC die coupled with the first side of the package substrate, where the IC die includes a power terminal; a stiffener coupled with the first side of the package substrate, where the stiffener surrounds the IC die and includes a conductive routing region coupled with the IC die power terminal, and a passive electronic device coupled with the conductive routing region. Other embodiments may be described and/or claimed.

9 Claims, 10 Drawing Sheets

(51) Int. Cl.
 H01L 23/00 (2006.01)
 H01L 49/02 (2006.01)
 H01L 23/498 (2006.01)
 H01L 21/50 (2006.01)
 H01L 23/16 (2006.01)
 H01L 23/31 (2006.01)
(52) U.S. Cl.
 CPC ...... *H01L 23/49838* (2013.01); *H01L 23/562* (2013.01); *H01L 23/642* (2013.01); *H01L 23/647* (2013.01); *H01L 28/40* (2013.01); *H01L 23/3128* (2013.01); *H01L 24/16* (2013.01); *H01L 2224/16227* (2013.01); *H01L 2224/32225* (2013.01); *H01L 2224/73204* (2013.01); *H01L 2924/15192* (2013.01); *H01L 2924/15311* (2013.01); *H01L 2924/19041* (2013.01); *H01L 2924/19043* (2013.01); *H01L 2924/19105* (2013.01); *H01L 2924/3511* (2013.01)
(58) Field of Classification Search
 CPC . H01L 2224/73204; H01L 2224/32225; H01L 2924/19043; H01L 2924/3511; H01L 2224/16227; H01L 2924/19041; H01L 23/50
 See application file for complete search history.

(56) References Cited

U.S. PATENT DOCUMENTS

| | | | |
|---|---|---|---|
| 2015/0159812 A1* | 6/2015 | Speer | H05K 1/189 362/382 |
| 2019/0006293 A1* | 1/2019 | Beatty | H01L 23/562 |
| 2019/0051615 A1* | 2/2019 | Nair | H01L 24/49 |

* cited by examiner

EXTENDED STIFFENER FOR PLATFORM MINIATURIZATION

CROSS REFERENCE TO RELATED APPLICATIONS

The present application claims international priority under 35 U.S.C. § 119 to co-pending Malaysian Patent Application No. PI 2017702439, filed Jul. 4, 2017, entitled "EXTENDED STIFFENER DESIGN FOR PLATFORM MINIATURIZATION", the entire content and disclosure of which is hereby incorporated by reference in its entirety.

TECHNICAL FIELD

The present disclosure relates generally to the field of packages for electronic devices, and more specifically to stiffeners for electronic devices in packages.

BACKGROUND

Single-sided printed circuit board (PCB) design allows thinner computing systems, but these designs do not allow PCB backside decoupling capacitors for system power noise decoupling. Legacy approaches for system power noise decoupling with PCB edge capacitors placed laterally to a package and silicon die on the PCB typically pose signal integrity degradation risks due to split power referencing.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
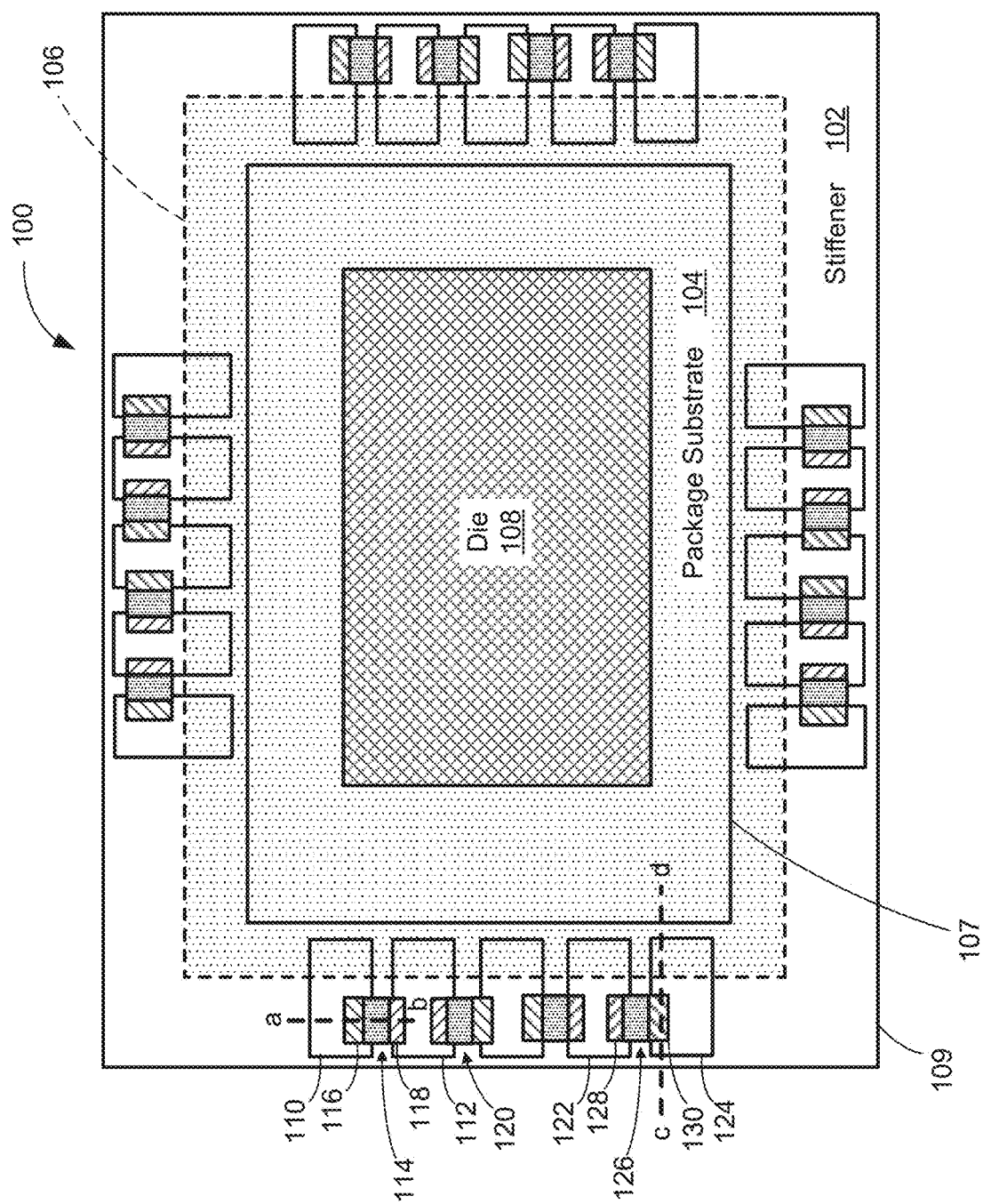
FIG. 1 schematically illustrates a top view of an integrated circuit (IC) package assembly that may include a package stiffener that extends beyond a package substrate outer edge, in accordance with various embodiments.

Embodiments herein may include IC package assemblies having a stiffener that extends beyond a package substrate outer edge, computing devices incorporating the IC package assemblies, methods for formation of the IC package assemblies, and associated configurations. An IC package assembly may include a package substrate having a first side, a second side opposite the first side, and an outer edge extending between the first side and the second side; an IC die coupled with the first side of the package substrate, where the IC die includes a power terminal; a stiffener coupled with the first side of the package substrate, where the stiffener surrounds the IC die and includes a conductive routing region coupled with the IC die power terminal, and a passive electronic device coupled with the conductive routing region.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

FIG. 1 schematically illustrates a top view of an IC package assembly 100 that may include a package stiffener 102, in accordance with various embodiments. In some embodiments, the IC package assembly 100 may include a substrate 104 that may have an outer edge 106. In various embodiments, an IC die 108 may be coupled with the package substrate 104. In some embodiments, the package stiffener 102 may include an inner edge 107 and an outer edge 109. In various embodiments, the outer edge 109 of the package stiffener 102 may extend beyond the package substrate outer edge 106 on one or more sides of the package substrate 104. In some embodiments, the package stiffener 102 may extend beyond the package substrate outer edge 106 on all sides of the package substrate 104 in a plane of the package stiffener 102, as shown. In various embodiments, the package stiffener 102 may surround the IC die 108, as shown, where the inner edge 107 of the package stiffener 102 extends around the die 108 in a plane of the package stiffener 102.

Although FIG. 1 is described as a top view of the IC package assembly 100, the package stiffener 102 is shown in a partial x-ray view to better illustrate elements and components coupled with and/or on a bottom side of the package stiffener 102. In some embodiments, the package stiffener 102 may include a first conductive routing region 110 and a second conductive routing region 112. In some embodiments, a first capacitor 114 having a first terminal 116 and a second terminal 118 may be coupled with the package stiffener 102. In various embodiments, the first conductive routing region 110 may be electrically coupled with the first terminal 116 and the second conductive routing region 112 may be electrically coupled with the second terminal 118. A second capacitor 120 may have a terminal, not labeled for clarity, that is also electrically coupled with the second conductive routing region 112 in some embodiments.

In some embodiments, the package stiffener 102 may include a third conductive routing region 122 and a fourth conductive routing region 124. In various embodiments, a third capacitor 126 having a first terminal 128 and a second terminal 130 may be coupled with the package stiffener 102. In some embodiments, the third conductive routing region 122 may be electrically coupled with the first terminal 128 of the third capacitor 126 and the fourth conductive routing region 124 may be electrically coupled with the second terminal 130 of the third capacitor 126. In some embodiments, the IC package assembly 100 may include additional conductive routing regions and/or additional passive electronic devices (e.g., capacitors, resistors, inductors, or any other suitable device), not labeled for clarity. In various embodiments, the conductive routing regions, including the first conductive routing region 110, the second conductive routing region 112, the third conductive routing region 122, and the fourth conductive routing region 124 may be formed of a metal foil laminate, a conductive ink, or any other suitable material or combination of materials.

In some embodiments, the first capacitor 114, the second capacitor 120, and/or the third capacitor 126 may be a decoupling capacitor coupled with power (e.g., Vcc) and ground (e.g., Vss) through the conductive routing regions. In some embodiments, the first terminal 116 of the first capacitor 114 and second terminal 130 of the third capacitor 126 may be coupled with Vcc. In some embodiments, the second terminal 118 of the first capacitor 114 and the first terminal 128 of the third capacitor 126 may be coupled with Vss. In various embodiments, the first conductive routing region 110 and the fourth conductive routing region 124 may be coupled with Vcc. In some embodiments, the second conductive routing region 112 and the third conductive routing region 122 may be coupled with Vss. In some embodiments, the conductive routing regions may be arranged such that they are coupled with Vcc and Vss in an alternating fashion, where the unlabeled conductive routing region between the second conductive routing region 112 and the third conductive routing region 122 may be coupled with Vcc.

Figure 2:
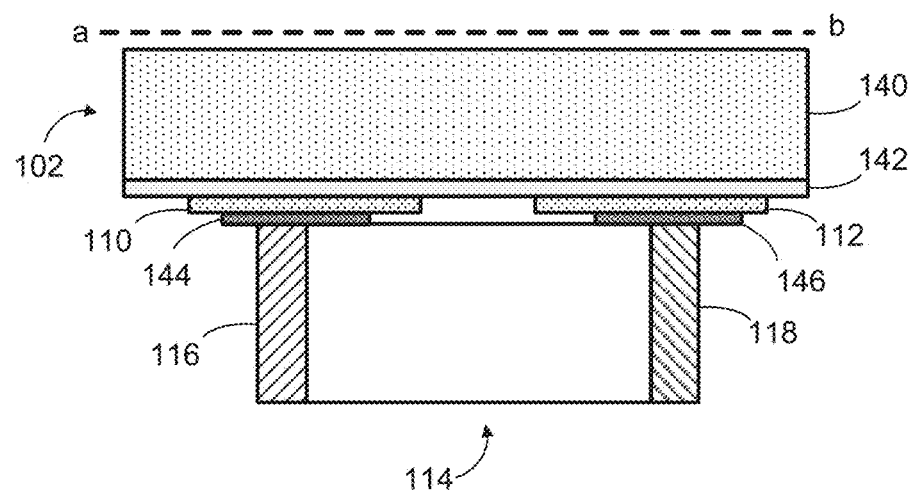
FIG. 2 schematically illustrates a cross-sectional side view of a portion of the IC package assembly shown in FIG. 1, in accordance with various embodiments.

FIG. 2 schematically illustrates a cross-sectional side view of a portion of the IC package assembly 100 shown in FIG. 1 along the line a-b, in accordance with various embodiments. In some embodiments, the package stiffener 102 may include a first layer 140 (e.g., a metal layer) and a second insulating layer 142 (e.g., a laminated dielectric layer). In various embodiments, the first conductive routing region 110 and the second conductive routing region 112 may be coupled with the second insulating layer 142, which may insulate the conductive routing regions from the first layer 140 in some embodiments. In various embodiments, the first terminal 116 of the first capacitor 114 may be coupled to the first conductive routing region 110 with a conductive adhesive 144 and/or the second terminal 118 may be coupled to the second conductive routing region with a conductive adhesive 146. However, it should be understood that any suitable coupling techniques and/or materials (e.g., solder) may be used instead of or in addition to conductive adhesive in other embodiments.

Figure 3:
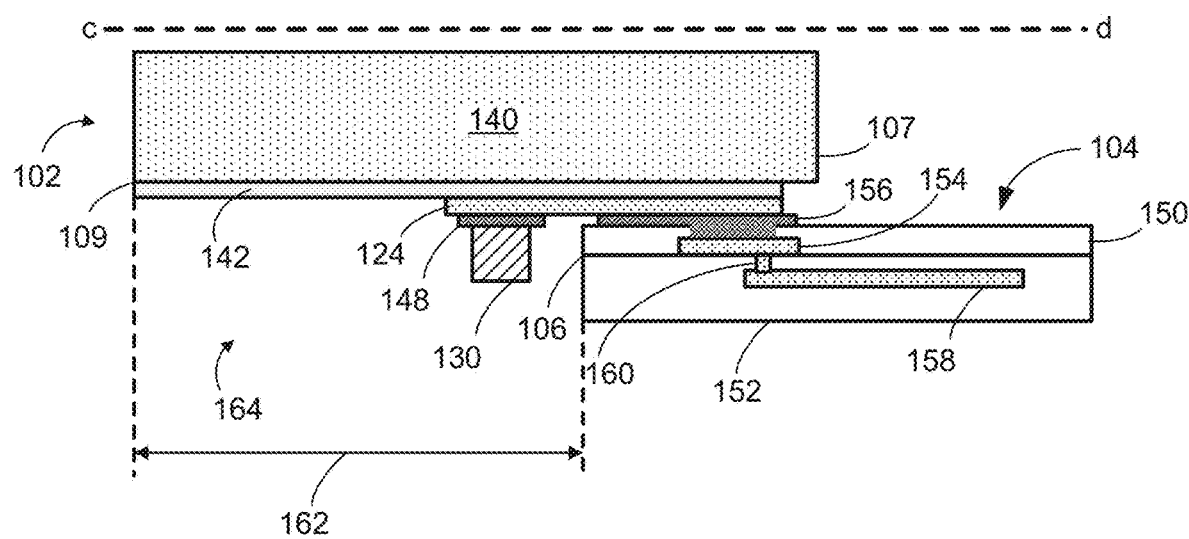
FIG. 3 schematically illustrates a cross-sectional side view of another portion of the IC package assembly shown in FIG. 1, in accordance with various embodiments.

FIG. 3 schematically illustrates a cross-sectional side view of another portion of the IC package assembly 100 shown in FIG. 1 along the line c-d, in accordance with various embodiments. In some embodiments, the second terminal 130 of the third capacitor 126 may be coupled with the fourth conductive routing region 124 with a conductive adhesive 148. In some embodiments, the package substrate 104 may include a first layer 150 and a second layer 152. A conductive pad 154 may be formed in and/or on the first layer 150. In some embodiments, the fourth conductive routing region 124 may be electrically coupled with the conductive pad 154 with a conductive adhesive 156. In some embodiments, any suitable coupling technique and/or material (e.g., solder) may be used instead of or in addition to the conductive adhesive 148 and/or conductive adhesive 156. In various embodiments, the second layer 152 may include a conductive routing trace 158 that may be electrically coupled to the conductive pad 154 (e.g., with a via 160). In some embodiments, the conductive routing trace 158 may be coupled with one or more terminals (e.g., a power terminal (Vcc)) of the die 108, not shown for clarity. In some embodiments, the outer edge 109 of the package stiffener 102 may extend a distance 162 beyond the outer edge 106 of the package substrate 104 in an overhang region 164 where one or more passive devices (e.g., third capacitor 126) may be mounted in various embodiments. Although not shown in FIG. 3, in some embodiments, the first terminal 128 of the third capacitor 126 may be coupled with a ground (e.g., Vss) pad on the package substrate 104 in similar fashion to the way the second terminal 130 is coupled with the conductive pad 154. In some embodiments, the first layer 150 may be a solder resist layer. In various embodiments, one or more of the stiffener 102 or the package substrate 104 may have a different number of layers and/or one or more other types of layers than shown.

Figure 4:
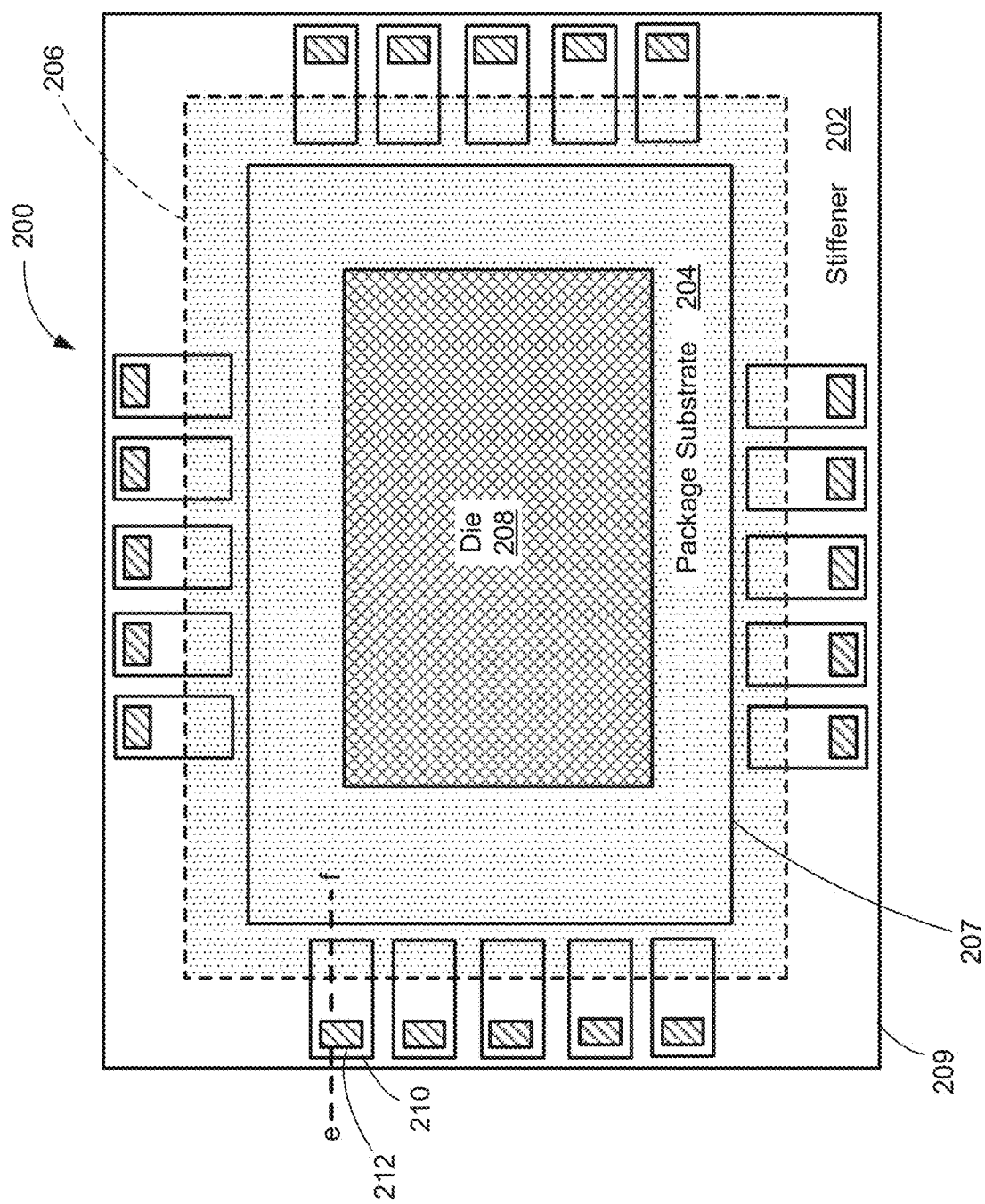
FIG. 4 schematically illustrates a top view of an IC package assembly that may include a package stiffener that extends beyond a package substrate outer edge and a vertically positioned decoupling capacitor, in accordance with various embodiments.

FIG. 4 schematically illustrates a top view of an IC package assembly 200 that may include a package stiffener 202, in accordance with various embodiments. In some embodiments, the IC package assembly 200 may include a substrate 204 that may have an outer edge 206. In various embodiments, an IC die 208 may be coupled with the package substrate 204. In some embodiments, the package stiffener 202 may include an inner edge 207 and an outer edge 209. In various embodiments, the outer edge 209 of the package stiffener 202 may extend beyond the package substrate outer edge 206 on one or more sides of the package substrate 204. In some embodiments, the package stiffener 202 may extend beyond the package substrate outer edge 106 on all sides of the package substrate 204 in a plane of the package stiffener 202, as shown. In various embodiments, the package stiffener 202 may surround the IC die 208, as shown, where the inner edge 207 of the package stiffener 202 extends around the die 208 in a plane of the package stiffener 202.

Although FIG. 4 is described as a top view of the IC package assembly 200, the package stiffener 202 is shown in a partial x-ray view to better illustrate elements and components coupled with and/or on a bottom side of the package stiffener 202. In some embodiments, the package stiffener 202 may include conductive routing region 210. In various embodiments, a capacitor may have a first terminal 212 that may be electrically coupled with the conductive routing region 210. In some embodiments, the IC package assembly 200 may include additional conductive routing regions and passive electronic devices (e.g., capacitors, resistors, inductors, or any other suitable device), not labeled for clarity. In various embodiments, the conductive routing regions, including the conductive routing region 210, may be formed of a metal foil laminate, a conductive ink, or any other suitable material or combination of materials. In some embodiments, the capacitor with the first terminal 212 may be a decoupling capacitor, and the first terminal 212 may be coupled with power (e.g., Vcc) through the conductive routing region 210. In some embodiments, all of the conductive routing regions on the package stiffener 202 may be coupled with power (e.g., Vcc).

Figure 5:
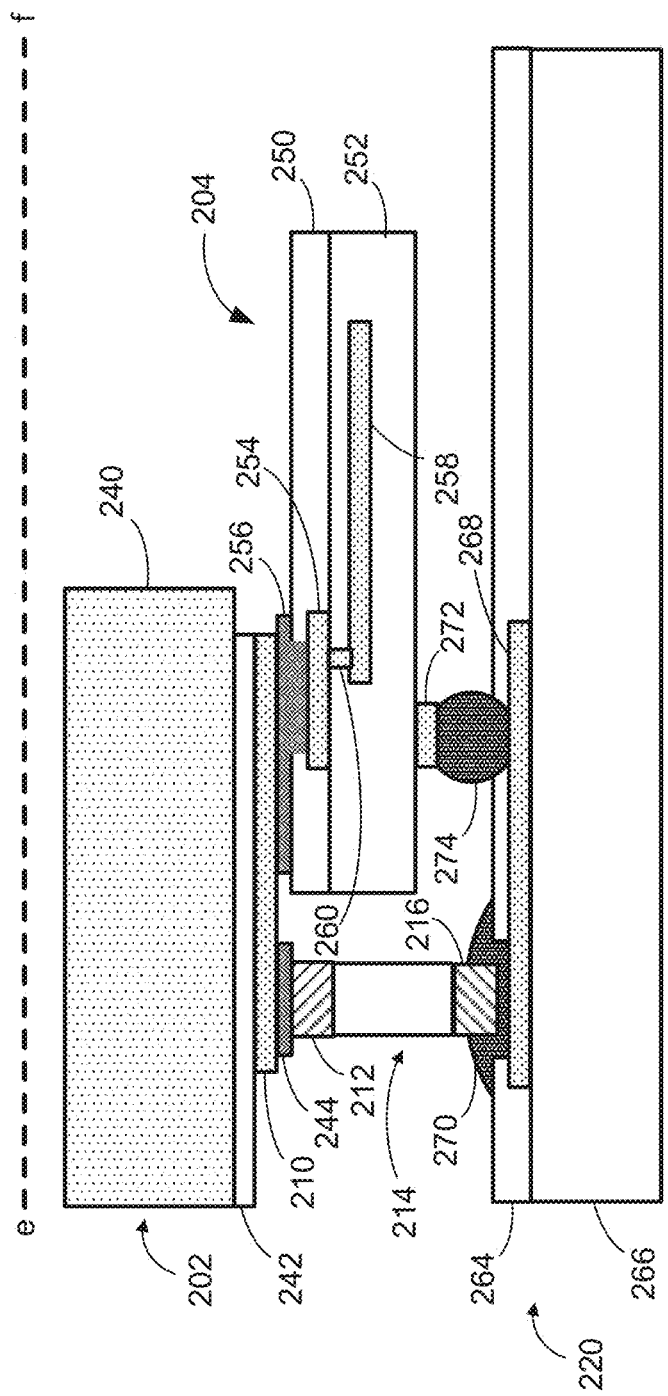
FIG. 5 schematically illustrates a cross-sectional side view of a portion of the IC package assembly shown in FIG. 4, in accordance with various embodiments.

FIG. 5 schematically illustrates a cross-sectional side view of a portion of the IC package assembly 200 shown in FIG. 4 along the line e-f coupled with a printed circuit board (PCB) 220 (e.g., a motherboard), in accordance with various embodiments. In some embodiments, the package stiffener 202 may include a first layer 240 (e.g., a metal layer) and a second insulating layer 242 (e.g., a laminated dielectric layer). In various embodiments, the conductive routing region 210 may be coupled with the second insulating layer 242, which may insulate the conductive routing region 210 from the first layer 240 in some embodiments. In various embodiments, the first terminal 212 of a capacitor 214 may be coupled to the conductive routing region 210 with a conductive adhesive 244. However, it should be understood that any suitable coupling techniques and/or materials (e.g., solder) may be used instead of or in addition to conductive adhesive in other embodiments.

In some embodiments, the package substrate 204 may include a first layer 250 and a second layer 252. A conductive pad 254 may be formed in and/or on the first layer 250. In some embodiments, the conductive routing region 210 may be electrically coupled with the conductive pad 254 with a conductive adhesive 256. In various embodiments, the second layer 252 may include a conductive routing trace 258 that may be electrically coupled to the conductive pad 254 (e.g., with a via 260). In some embodiments, the conductive routing trace 258 may be coupled with one or more terminals (e.g., a power terminal (Vcc)) of the die 208, not shown for clarity.

In some embodiments, the package substrate 204 and the capacitor 214 may be electrically coupled with the PCB 220. In some embodiments, the PCB 220 may include a first layer 264 and a second layer 266. In various embodiments, the PCB 220 may include one or more conductive pads 268. In some embodiments, the capacitor 214 may have a second terminal 216 electrically coupled to the conductive pad 268 with a conductive adhesive 270. In some embodiments, the capacitor 214 may be a decoupling capacitor and the conductive pad 268 may be a ground (e.g., Vss) pad. In some embodiments, the package substrate 204 may include a conductive pad 272. In some embodiments, an interconnect 274 (e.g., a solder ball) may electrically couple the conductive pad 268 of the package substrate 204 to the conductive pad 268 of the PCB 220. In some embodiments, the first layer 250 or the first layer 264 may be a solder resist layer. In various embodiments, one or more of the stiffener 202, the package substrate 204, or the PCB 220 may have a different number or layers and/or one or more other types of layers than shown.

Figure 6:
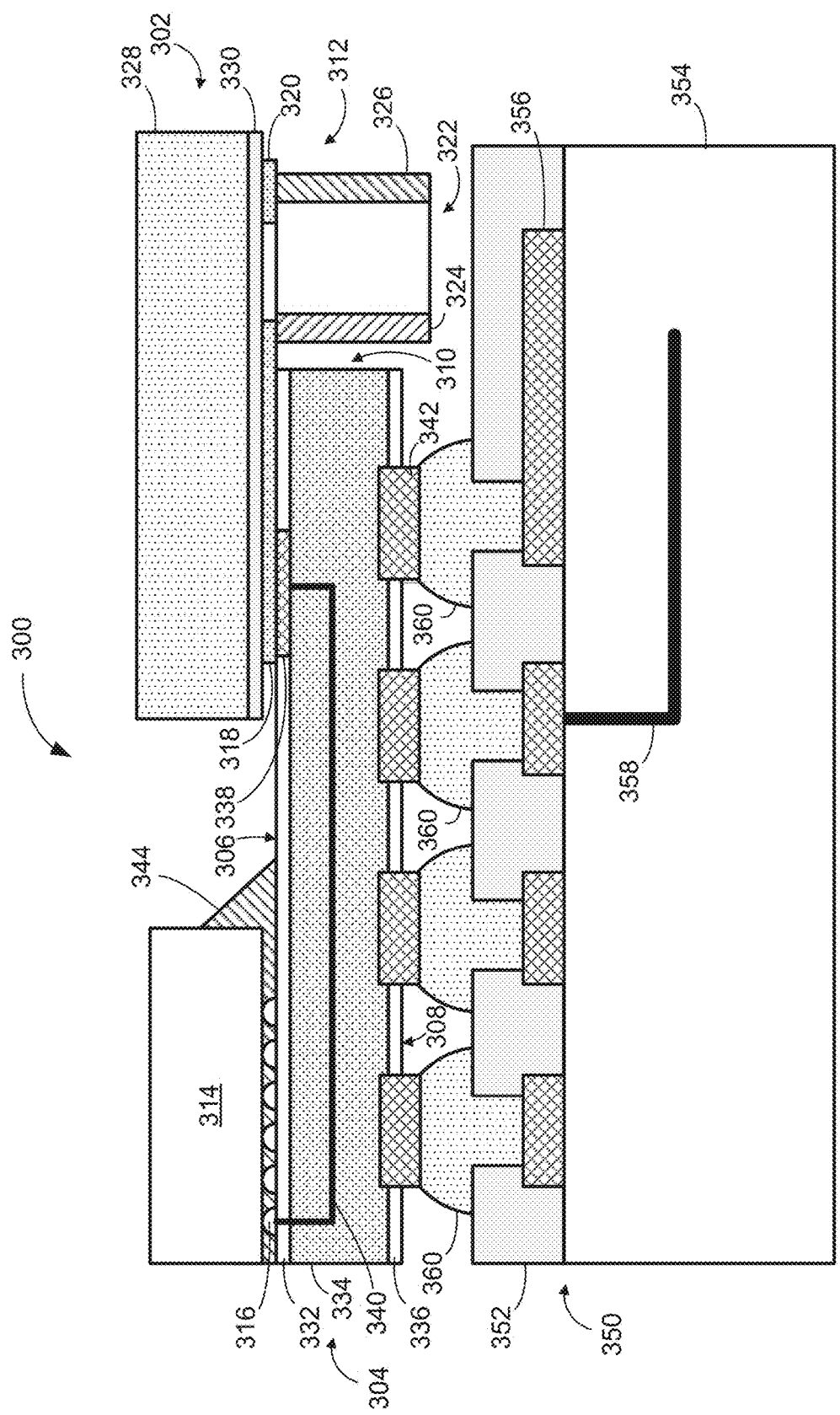
FIG. 6 schematically illustrates a cross-sectional side view of an integrated circuit (IC) package assembly having a package stiffener that extends beyond a package substrate outer edge, in accordance with various embodiments.

FIG. 6 schematically illustrates a cross-sectional side view of an integrated circuit (IC) package assembly 300 having a package stiffener 302, in accordance with various embodiments. In some embodiments, the IC package assembly 300 may be structured in a similar fashion to that described with respect to the IC package assembly 100 of FIGS. 1-3. In some embodiments, the IC package assembly 300 may include a substrate 304 having a first side 306, a second side 308 opposite the first side 306, and an outer edge 310 that extends between the first side 306 and the second side 308. In various embodiments, the stiffener 302 may be coupled with the first side 306 of the substrate 304. In some embodiments, the package stiffener 302 may extend beyond the outer edge 310 in an overhang region 312. In various embodiments, the IC package assembly 300 may include an IC die 314 coupled with the first side 306 of the substrate 304. In some embodiments, the IC die 314 may include a power terminal 316 (e.g., Vcc).

In some embodiments, the stiffener 302 may include a first conductive routing region 318 that may be electrically coupled with the power terminal 316 of the IC die 314. In some embodiments, the stiffener 302 may include a second conductive routing region 320. In some embodiments, the second conductive routing region 320 may be coupled with ground (e.g., Vss). In some embodiments, a capacitor 322 may include a first terminal 324 electrically coupled with the first conductive routing region 318 and a second terminal 326 electrically coupled with the second conductive routing region 320. In some embodiments, some other type of passive electronic device (e.g., a resistor) may be coupled with the first conductive routing region 318 and or the second conductive routing region 320 instead of or in addition to the capacitor 322. In some embodiments, the stiffener 302 may surround the IC die 314, in similar fashion as shown with respect to FIG. 1.

In some embodiments, the package stiffener 302 may include a first layer 328 (e.g., a metal layer) and a second insulating layer 330 (e.g., a laminated dielectric layer). In various embodiments, the second insulating layer 330 may insulate the first conductive routing region 318 and the second conductive routing region 320 from the first layer 328. In some embodiments, the package substrate 304 may include a first layer 332, a second layer 334, and a third layer 336. In some embodiments, a conductive pad 338 may be formed in and/or on the first layer 332. In various embodiments, conductive routing 340 may electrically couple the power terminal 316 with the conductive pad 338. In some embodiments, the conductive routing 340 may run through the second layer 334. In various embodiments, the first conductive routing region 318 may be electrically coupled with the conductive pad 338. In some embodiments, one or more conductive pads 342, not all labeled for clarity, may be formed in and/or on the third layer 336. In some embodiments, the IC die 314 may be partially or fully covered by an encapsulant 344 or any other suitable material. In some embodiments, the encapsulant 344 may be used as an underfill for the IC die 314.

In some embodiments, the package substrate 304 of the IC package assembly 300 may be electrically coupled with a PCB 350. In various embodiments, the PCB may include a first layer 352 and a second layer 354. In various embodiments, one or more conductive pads 356, not all labeled for clarity, may be formed in and/or on the first layer 352. In some embodiments, one or more conductive routing traces 358 may be electrically coupled with one or more of the conductive pads 356. In some embodiments, the conductive pads 356 may be included in an L1 layer and/or the conductive routing traces 358 may be included in an L2 layer. In various embodiments, the conductive routing traces may carry L2 signals to and/or from one or more other components, not shown for clarity. In some embodiments, one or more interconnect structures 360 (e.g., solder balls) may electrically couple one or more of the conductive pads 342 with the conductive pads 356. In various embodiments, one or more of the stiffener 302, the package substrate 304, or the PCB 350 may have a different number of layers and/or one or more other types of layers than shown.

Figure 7:
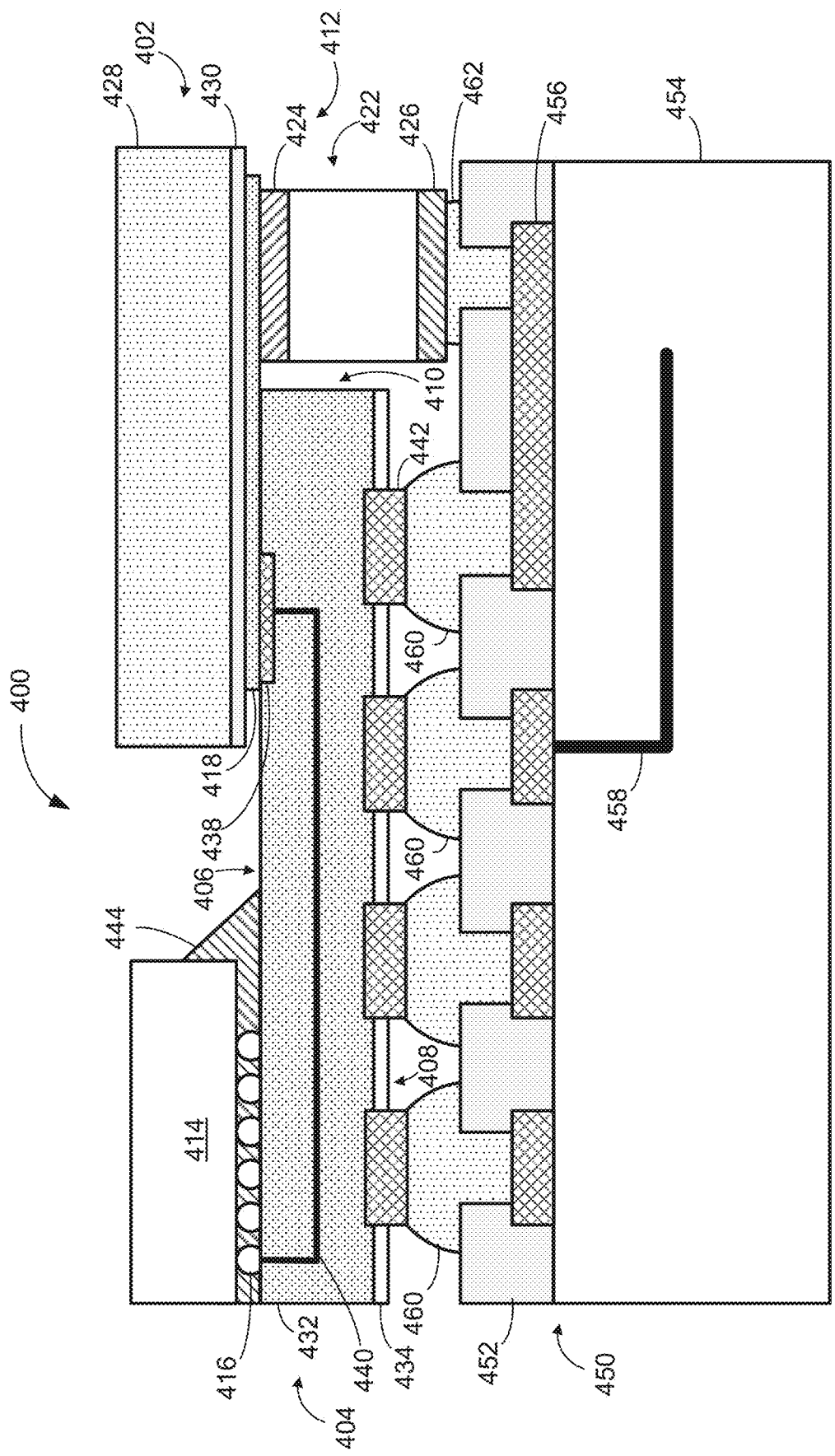
FIG. 7 schematically illustrates a cross-sectional side view of an IC package assembly that may have a vertically positioned decoupling capacitor, in accordance with various embodiments.

FIG. 7 schematically illustrates a cross-sectional side view of an integrated circuit (IC) package assembly 400 having a package stiffener 402, in accordance with various embodiments. In some embodiments, the IC package assembly 400 may be structured in a similar fashion to that described with respect to the IC package assembly 200 of FIGS. 4-5. In some embodiments, the IC package assembly 400 may include a substrate 404 having a first side 406, a second side 408 opposite the first side 406, and an outer edge 410 that extends between the first side 406 and the second side 408. In various embodiments, the stiffener 402 may be coupled with the first side 406 of the substrate 404. In some embodiments, the package stiffener 402 may extend beyond the outer edge 410 in an overhang region 412. In various embodiments, the IC package assembly 400 may include an IC die 414 coupled with the first side 406 of the substrate 404. In some embodiments, the IC die 414 may include a power terminal 416 (e.g., Vcc).

In various embodiments, the stiffener 402 may include a conductive routing region 418 that may be electrically coupled with the power terminal 416 of the IC die 414. In some embodiments, a capacitor 422 may include a first terminal 424 electrically coupled with the conductive routing region 418 and a second terminal 426. In some embodiments, some other type of passive electronic device (e.g., a resistor) may be coupled with the conductive routing region 418 instead of or in addition to the capacitor 422. In some embodiments, the stiffener 402 may surround the IC die 414, in similar fashion as shown with respect to FIG. 4.

In some embodiments, the package stiffener 402 may include a first layer 428 (e.g., a metal layer) and a second insulating layer 430 (e.g., a laminated dielectric layer). In various embodiments, the second insulating layer 430 may insulate the conductive routing region 418 from the first layer 428. In some embodiments, the package substrate 404 may include a first layer 432 and a second layer 434. In some embodiments, a conductive pad 438 may be formed in and/or on the first layer 432. In various embodiments, conductive routing 440 may electrically couple the power terminal 416 with the conductive pad 438. In some embodiments, the conductive routing 440 may run through the first layer 332. In other embodiments, the conductive routing may run through one or more other layers. In various embodiments, the conductive routing region 418 may be electrically coupled with the conductive pad 438. In some embodiments, one or more conductive pads 442, not all labeled for clarity, may be formed in and/or on the second layer 434. In some embodiments, the IC die 414 may be partially or fully covered by an encapsulant 444 or any other suitable material. In some embodiments, the encapsulant 444 may be used as an underfill for the IC die 414.

In some embodiments, the package substrate 404 of the IC package assembly 400 may be electrically coupled with a PCB 450. In various embodiments, the PCB may include a first layer 452 and a second layer 454. In various embodiments, one or more conductive pads 456, not all labeled for clarity, may be formed in and/or on the first layer 452. In some embodiments, one or more conductive routing traces 458 may be electrically coupled with one or more of the conductive pads 456. In some embodiments, the conductive pads 456 may be included in an L1 layer and/or the conductive routing traces 458 may be included in an L2 layer. In various embodiments, the conductive routing traces 458 may carry L2 signals to and/or from one or more other components, not shown for clarity. In some embodiments, one or more interconnect structures 460 (e.g., solder balls) may electrically couple one or more of the conductive pads 442 with the conductive pads 456. In some embodiments the second terminal 426 of the capacitor 422 may be electrically coupled with one or more of the conductive pads 456 with an interconnect structure 462 (e.g., a solder ball). In some embodiments, the conductive pad 456 electrically coupled with the second terminal 426 may be a ground pad (e.g., Vss). In various embodiments, one or more of the stiffener 402, the package substrate 404, or the PCB 450 may have a different number of layers and/or one or more other types of layers than shown.

Figure 8:
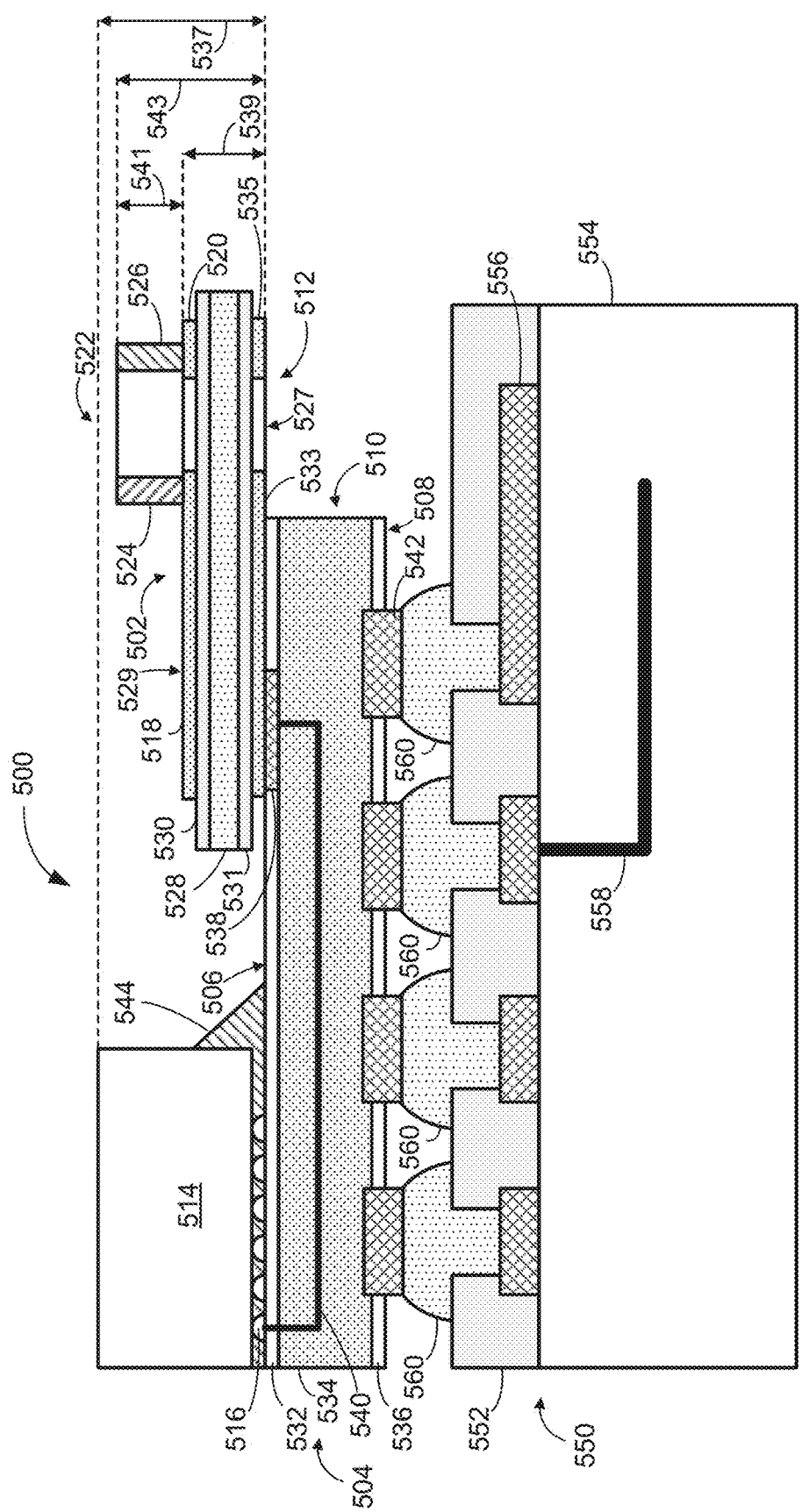
FIG. 8 schematically illustrates a cross-sectional side view of another IC package assembly that may have a stiffener that extends beyond a substrate outer edge, in accordance with various embodiments.

FIG. 8 schematically illustrates a cross-sectional side view of an integrated circuit (IC) package assembly 500 having a package stiffener 502, in accordance with various embodiments. In some embodiments, the IC package assembly 500 may include a substrate 504 having a first side 506, a second side 508 opposite the first side 506, and an outer edge 510 that extends between the first side 506 and the second side 508. In various embodiments, the stiffener 502 may be coupled with the first side 506 of the substrate 504. In some embodiments, the package stiffener 502 may extend beyond the outer edge 510 in an overhang region 512. In various embodiments, the IC package assembly 500 may include an IC die 514 coupled with the first side 506 of the substrate 504. In some embodiments, the IC die 514 may include a power terminal 516 (e.g., Vcc).

In various embodiments, the stiffener 502 may include a first conductive routing region 518 that may be electrically coupled with the power terminal 516 of the IC die 514. In some embodiments, the stiffener 502 may include a second conductive routing region 520 that may be electrically coupled with ground (e.g., Vss). In some embodiments, a capacitor 522 may include a first terminal 524 electrically coupled with the first conductive routing region 518 and a second terminal 526 electrically coupled with the second conductive routing region 520. As shown, in various embodiments, the stiffener 502 may have a first side 527 coupled with the package substrate 504, and the capacitor 522 may be coupled with a second side 529 of the stiffener 502 opposite the first side 527 of the stiffener 502.

In some embodiments, the package stiffener 502 may include a first layer 528 (e.g., a metal layer) and a second insulating layer 530 (e.g., a laminated dielectric layer). In various embodiments, the second insulating layer 530 may insulate the first conductive routing region 518 and the second conductive routing region 520 from the first layer 528. In some embodiments, the stiffener 502 may include a third insulating layer 531, a third conductive routing region 533 on the third insulating layer 531, and a fourth conductive routing region 535 on the third insulating layer 531. In some embodiments, the third conductive routing region 533 may be electrically coupled with the first conductive routing region 518, connection not shown for clarity, and the fourth conductive routing region 535 may be electrically coupled with the second conductive routing region 520, connection not shown for clarity.

In some embodiments, the IC die 514 may extend a distance 537 from the substrate 504 in a direction normal to a plane of the substrate 504. In some embodiments, the stiffener 502 may extend a distance 539 from the substrate 504 in a direction normal to the plane of the substrate, where the distance 539 may be less than the distance 537. In some embodiments, the capacitor 522 may extend a distance 541 from the stiffener 502 in a direction normal to a plane of the stiffener.

In some embodiments the stiffener 502 and the capacitor 522 may extend a combined distance 543 from the substrate 504 in a direction normal to the plane of the substrate. In some embodiments, the combined distance 543 may be less than or equal to the distance 537. In some embodiments, the distance 537 may be a thickness of the IC die 514 and the distance 539 may be a thickness of the stiffener 502.

In some embodiments, the package substrate 504 may include a first layer 532, a second layer 534, and a third layer 536. In some embodiments, a conductive pad 538 may be formed in and/or on the first layer 532. In various embodiments, conductive routing 540 may electrically couple the power terminal 516 with the conductive pad 538. In some embodiments, the conductive routing 540 may run through the second layer 534. In various embodiments, the first conductive routing region 518 may be electrically coupled with the conductive pad 538 (e.g., via the electrical coupling to the third conductive routing region 533). In some embodiments, one or more conductive pads 542, not all labeled for clarity, may be formed in and/or on the third layer 536. In some embodiments, the IC die 514 may be partially or fully covered by an encapsulant 544 or any other suitable material. In some embodiments, the encapsulant 544 may be used as an underfill for the IC die 514.

In some embodiments, same other type of passive electronic device (e.g., a resistor) may be coupled with the first conductive routing region 518 and or the second conductive routing region 520 instead of or in addition to the capacitor 522. In some embodiments, the stiffener 502 may surround the IC die 514, in similar fashion as shown with respect to FIG. 1. In some embodiments, the package substrate 504 and/or the IC die 514 may be structured in a similar fashion to that described with respect to the package substrate 104 and/or the IC die 108, respectively, of the IC package assembly 100 described with respect to FIGS. 1-3.

In some embodiments, the package substrate 504 of the IC package assembly 500 may be electrically coupled with a PCB 550. In various embodiments, the PCB may include a first layer 552 and a second layer 554. In various embodiments, one or more conductive pads 556, not all labeled for clarity, may be formed in and/or on the first layer 552. In some embodiments, one or more conductive routing traces 558 may be electrically coupled with one or more of the conductive pads 556. In some embodiments, the conductive pads 556 may be included in an L1 layer and/or the conductive routing traces 558 may be included in an L2 layer. In various embodiments, the conductive routing traces 558 may carry L2 signals to and/or from one or more other components, not shown for clarity. In some embodiments, one or more interconnect structures 560 (e.g., solder balls) may electrically couple one or more of the conductive pads 542 with the conductive pads 556. In various embodiments, one or more of the stiffener 502, the package substrate 504, or the PCB 550 may have a different number of layers and/or one or more other types of layers than shown.

In some embodiments, one or more of the IC package assemblies 100, 200, 300, 400, and/or 500 may include additional electrical routing features, not shown for clarity, such as for example, traces, pads, through-holes, vias, or lines configured to route electrical signals to or from the IC die 108, 208, 314, 414, and/or 514. In various embodiments, any type of suitable die attach technique, packaging technique, or interconnect configuration may be used (e.g., leads, flip chip, ball grid array (BGA) land grid array (LGA)). Some embodiments may include suitable combinations of flip-chip and/or wire-bonding configurations, interposers, multi-chip package configurations including system-in-package (SIP) and/or package-on-package (PoP) configurations. Other suitable techniques to route electrical signals between passive components on the stiffener 102, 202, 302, 402, and/or 502 and other components (e.g., IC die 108, 208, 314, 414, 514 and/or PCB 220, 350, 450, 550) may be used in some embodiments. In some embodiments, one or more additional dies may be included in the IC package assembly 100, 200, 300, 400, and/or 500. The additional dies may include IC dies such as memory dies and/or radio frequency (RF) communication dies in various embodiments. The additional dies may include sensors, gyroscopes, a geographic positioning system (GPS), and/or other system elements.

In various embodiments, the IC die (e.g., IC die 108, 208, 314, 414, and/or 514) may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the IC die may be, include, or be a part of a radio frequency (RE) die. In other embodiments, the die may be, include, or be a part of a processor, memory, system-on-chip (SoC), or application specific integrated circuit (ASIC).

In some embodiments, the IC die (e.g., IC die 108, 208, 314, 414, and/or 514) may generally include a semiconductor substrate, one or more device layers, and one or more interconnect layers. The semiconductor substrate may be substantially composed of a bulk semiconductor material such as, for example, silicon, in some embodiments. The device layer may represent a region where active devices such as transistor devices are formed on the semiconductor substrate. The device layer may include, for example, structures such as channel bodies and/or source/drain regions of transistor devices. The interconnect layer may include interconnect structures that are configured to route electrical signals to or from the active devices in the device layer. For example, the interconnect layer may include trenches and/or vias to provide electrical routing and/or contacts. In some embodiments, one or more electrically functional through-silicon vias (TSVs) (not shown) may extend through the interconnect layer, the device layer, and the semiconductor substrate such that additional circuitry (not shown) and/or dies (not shown) may be coupled with an inactive side of the IC die. In some embodiments, the die-level interconnect structures may be configured to route electrical signals between the IC die and other electrical devices. The electrical signals may include, for example, input/output (I/O) signals and/or power/ground signals that are used in connection with operation of the IC die.

Figure 9:
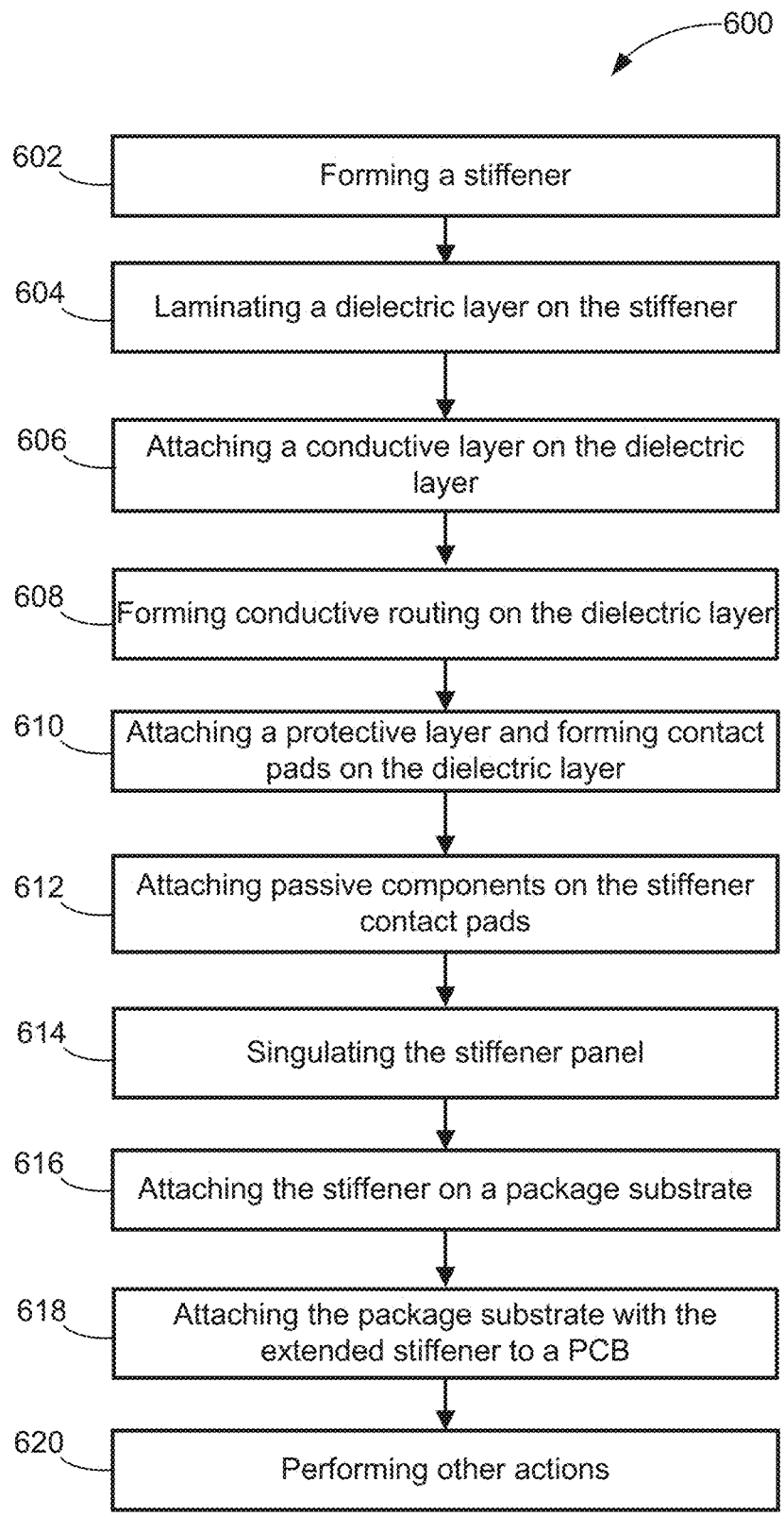
FIG. 9 schematically illustrates a flow diagram for a process of fabricating an extended stiffener, in accordance with various embodiments.

FIG. 9 schematically illustrates a flow diagram for a process 600 of fabricating an extended stiffener (e.g., stiffener 102, 202, 302, 402, and/or 502), in accordance with various embodiments. In some embodiments, at a block 602, the process 600 may include forming a stiffener. In some embodiments, more than one stiffener may be formed in a stiffener panel at the block 602, and may be singulated (e.g., as described with respect to block 614) into individual stiffeners after one or more additional actions are performed. In various embodiments, forming the stiffener may be performed with a metal injection molding process, a casting process, or any other suitable process. In some embodiments, at a block 604, the process 600 may include laminating a dielectric layer (e.g., insulating layer 142, 242, 330, 430, and/or 530) on a first surface of the stiffener. In various embodiments, a lamination process, a hot-press process or any other suitable process may be used to laminate the dielectric layer on the first surface of the stiffener. In some embodiments, an insulating layer that may not be a dielectric layer may be formed, deposited, or otherwise applied to the stiffener instead of, or in addition to, laminating the dielectric layer at the block 604.

In some embodiments, at a block 606, the process 600 may include attaching a conductive layer on the dielectric layer. In various embodiments, the conductive layer may be attached with a metal foil lamination process, a conductive ink dispensing process, or any other suitable process. In some embodiments, at a block 608, the process 600 may include forming conductive routing (e.g., conductive routing region 110, 112, 122, 124, 210, 318, 320, 418, 518, and/or 520) on the dielectric layer. In various embodiments, the conductive routing may be formed with a photolithography and etching process or any other suitable process. In some embodiments, at a block 610, the process 600 may include attaching a protective layer and/or forming contact pads on the dielectric layer. In various embodiments, attaching the protective layer and forming the contact pads may be performed using a solder resist lamination and photolithography process, or any other suitable process. In some embodiments, at a block 612, the process 600 may include attaching passive components (e.g., capacitor 114, 120, 126, 214, 322, 422, and/or 522) on stiffener contact pads. In various embodiments, the passive components may be attached with a surface mounting reflow process or any other suitable process.

In some embodiments, at a block 614, the process 600 may include singulating the stiffener panel. In various embodiments, the stiffener panel may be singulated with a laser cutting process, a mechanical sawing process, or any other suitable process. In some embodiments, at a block 616, the process 600 may include attaching the stiffener to a package substrate (e.g., package substrate 104, 204, 304, 404, or 504). In various embodiments, the stiffener may be attached to the package substrate with a surface mounting reflow process or any other suitable process. In some embodiments, at a block 618, the process 600 may include attaching the package substrate with the attached extended stiffener to a printed circuit board (e.g., PCB 220, 350, 450, or 550). In various embodiments, the package substrate with the attached extended stiffener may be attached to the PCB with a surface mounting reflow process or any other suitable process. In some embodiments, at a block 620, the process 600 may include performing other actions such as laminating a dielectric layer (e.g., insulating layer 531) on a second surface of the stiffener and/or forming conductive routing (e.g., conductive routing regions 533, 535) on the second surface of the stiffener before attaching to a package substrate, or any other suitable action.

Figure 10:
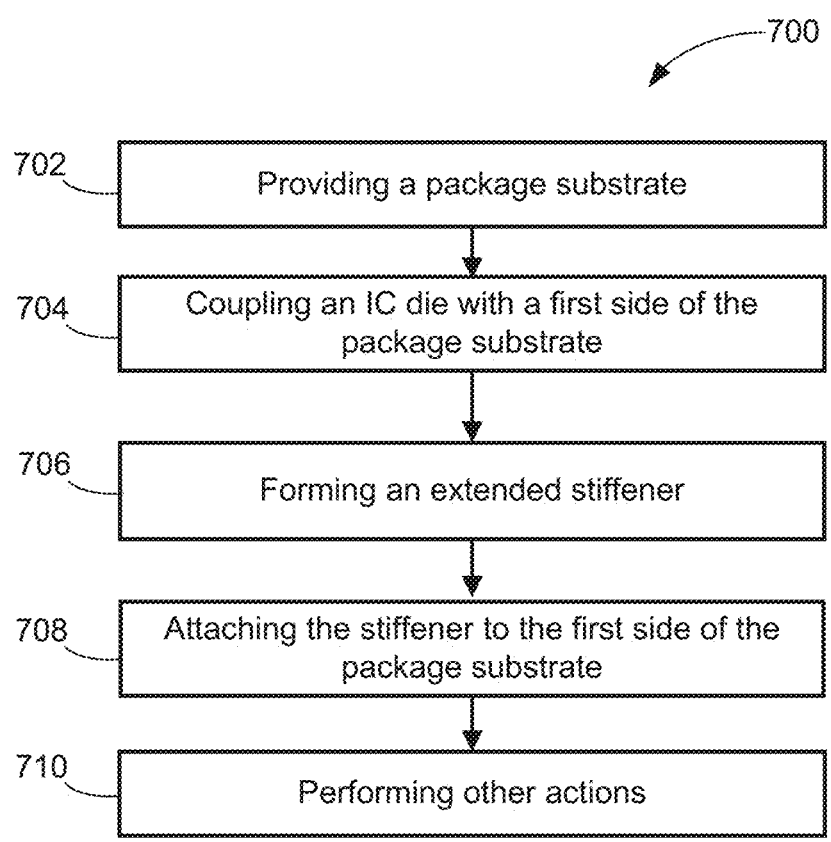
FIG. 10 schematically illustrates a flow diagram for a process of fabricating an IC package assembly such as one or more of the IC package assemblies of FIGS. 1-8, in accordance with various embodiments.

FIG. 10 schematically illustrates a flow diagram for a process 700 of fabricating an IC package assembly such as one or more of the IC package assemblies of FIGS. 1-8, in accordance with various embodiments. In some embodiments, at a block 702, the process 700 may include providing a package substrate (e.g., substrate 104, 204, 304, 404, or 504) having a first side, a second side opposite the first side, and an outer edge extending between the first side and the second side. In some embodiments, at a block 704, the process 700 may include coupling an IC die (e.g., IC die 108, 208, 314, 414, or 514) with the first side of the package substrate, where the IC die includes a power terminal (e.g., power terminal 316, 416, or 516). In some embodiments, at a block 706, the process 700 may include forming an extended stiffener (e.g., stiffener 102, 202, 302, 402, or 502). In some embodiments, forming the extended stiffener at the block 706 may include one or more of the actions described with respect to the process 600 of FIG. 9 or any other suitable action. In some embodiments, forming the extended stiffener at the block 706 may include laminating a dielectric layer on a first side of the stiffener, forming a conductive routing region on the dielectric layer, and electrically coupling a passive component with the conductive routing region. In some embodiments, at a block 708, the process 700 may include attaching the stiffener to the first side of the package substrate such that the stiffener surrounds the IC die and a first terminal of the passive component is electrically coupled with the IC die power terminal (e.g., Vcc) via the stiffener conductive routing region. In some embodiments, at a block 710, the process 700 may include performing other actions (e.g., forming additional conductive routing regions, electrically coupling additional passive components to the stiffener, electrically coupling a second terminal of a passive terminal to a ground terminal (e.g., Vss) of the IC die via a conductive routing region, and/or coupling the IC package assembly to a PCB).

Figure 11:
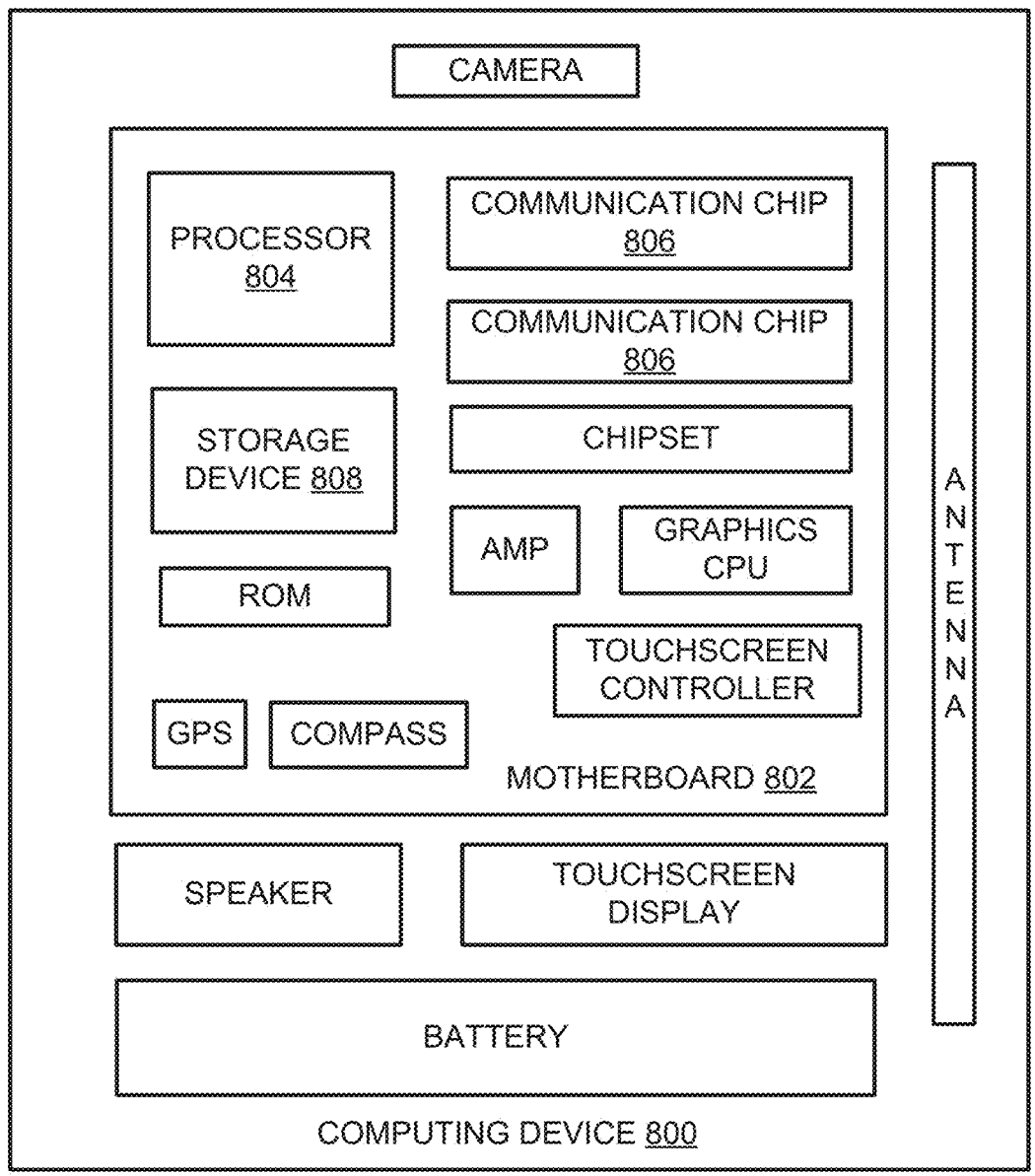
FIG. 11 schematically illustrates a computing device that may include an IC package assembly of one or more of FIGS. 1-10, in accordance with various embodiments.

Embodiments of the present disclosure may be implemented into a system using the packages and manufacturing techniques disclosed herein. FIG. 11 schematically illustrates a computing device 800, in accordance with some implementations, which may include one or more IC package assemblies, such as the IC package assembly 100 of FIGS. 1-3, the IC package assembly 200 of FIGS. 4-5, the IC package assembly 300 of FIG. 6, the IC package assembly 400 of FIG. 7, the IC package assembly 500 of FIG. 8, the extended stiffener described with respect to FIG. 9, and/or the IC package assembly described with respect to FIG. 10.

The computing device 800 may be, for example, a mobile communication device or a desktop or rack-based computing device. The computing device 800 may house a board such as a motherboard 802. The motherboard 802 may include a number of components, including (but not limited to) a processor 804 and at least one communication chip 806. Any of the components discussed herein with reference to the computing device 800 may include an IC package assembly such as the IC package assembly 100, 200, 300, 400, or 500 that may include an extended stiffener with an electrically coupled passive component in an overhang region extending beyond an outer edge of a package substrate. In further implementations, the communication chip 806 may be part of a multi-die package.

The computing device 800 may include a storage device 808. In some embodiments, the storage device 808 may include one or more solid state drives. Examples of storage devices that may be included in the storage device 806 include volatile memory (e.g., dynamic random access memory (DRAM)), non-volatile memory (e.g., read-only memory, ROM, flash memory, and mass storage devices (such as hard disk drives, compact discs (CDs), digital versatile discs (DVDs), and so forth).

Depending on its applications, the computing device 800 may include other components that may or may not be physically and electrically coupled to the motherboard 802. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 806 and the antenna may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WIMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806, For instance, a first communication chip 806 may be dedicated to shorter range wireless communications such as Wi-Fi and Bluetooth, and a second communication chip 806 may be dedicated to longer range wireless communications such as GPS, EDGE, GPRS, CDMA, WiMAX, LTE, EV-DO, and others. In some embodiments, the communication chip 806 may support wired communications. For example, the computing device 800 may include one or more wired servers.

The processor 804 and/or the communication chip 806 of the computing device 800 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory. In various embodiments, a processor may include a single core or multiple cores.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data. In some embodiments, the IC package assembly 100, 200, 300, 400, and/or 500 may provide for improved device performance in a computing device such as computing device 800 in comparison to legacy approaches. For example, in some embodiments, they may enable single-sided PCB design approaches that maintain signal integrity and allow for thinner systems and/or reduced board cost (e.g., by functioning with fewer PCB layers than typically used in legacy approaches).

The following paragraphs provide examples of various ones of the embodiments disclosed herein.

Example 1 may include an integrated circuit (IC) package assembly comprising: a package substrate having a first side, a second side opposite the first side, and an outer edge extending between the first side and the second side; an IC die coupled with the first side of the package substrate, wherein the IC die includes a power terminal; a stiffener coupled with the first side of the package substrate, wherein the stiffener surrounds the IC die and includes a conductive routing region coupled with the IC die power terminal; and a passive electronic device coupled with the conductive routing region.

Example 2 may include the subject matter of Example 1, wherein the stiffener has a first side and a second side opposite the first side, the first side of the stiffener is coupled with the first side of the package substrate, the stiffener includes an overhang region where an edge of the stiffener extends beyond the package substrate cuter edge, and the passive electronic device is coupled with the first side of the stiffener in the overhang region.

Example 3 may include the subject matter of Example 1, wherein the passive electronic device is a capacitor.

Example 4 may include the subject matter of Example 3, wherein the capacitor includes a first terminal and a second terminal, wherein the first terminal is electrically coupled with the stiffener conductive routing region.

Example 5 may include the subject matter of Example 4, wherein the conductive routing region is a first conductive routing region and the stiffener includes a second conductive routing region electrically coupled with a ground terminal of the IC die and the second terminal of the capacitor.

Example 6 may include the subject matter of any one of Examples 1-5, wherein the stiffener extends beyond the entire outer edge of the substrate.

Example 7 may include the subject matter of any one of Examples 1-6, wherein the stiffener includes a metal structure and a dielectric layer between the metal structure and the conductive routing region.

Example 8 may include the subject matter of any one of Examples 1-7, wherein the conductive routing region is formed of metal foil laminate or conductive ink.

Example 9 may include the subject matter of Example 1, wherein the stiffener has a first side and a second side opposite the first side, the first side of the stiffener is coupled with the first side of the package substrate, and the passive electronic device is coupled with the second side of the stiffener.

Example 10 may include the subject matter of any one of Examples 1-9, wherein the stiffener has a thickness less than a thickness of the IC die.

Example 11 may include a method of fabricating an integrated circuit (IC) package assembly, the method comprising: providing a package substrate having a first side, a second side opposite the first side, and an outer edge extending between the first side and the second side; coupling an IC die with the first side of the package substrate, wherein the IC die includes a power terminal; attaching a passive component to a stiffener conductive routing region; and attaching the stiffener to the first side of the package substrate such that the stiffener surrounds the IC die and a terminal of the passive component is electrically coupled with the IC die power terminal via the stiffener conductive routing region.

Example 12 may include the subject matter of Example 11, further comprising forming the stiffener.

Example 13 may include the subject matter of any one of Examples 11-12, further comprising: laminating a dielectric layer on the first side of the stiffener; forming a conductive routing region on the dielectric layer; and electrically coupling the passive component with the conductive routing region.

Example 14 may include the subject matter of Example 13, wherein forming a conductive routing region includes attaching a conductive layer on the dielectric layer and forming the conductive routing region in the conductive layer.

Example 15 may include the subject matter of Example 14, wherein the conductive layer is a metal foil layer or a conductive ink, and wherein forming the conductive routing region in the conductive layer includes etching a portion of the conductive layer.

Example 16 may include the subject matter of any one of Examples 11-15, wherein the passive component is a capacitor.

Example 17 may include the subject matter of Example 16, wherein electrically coupling the capacitor with the conductive routing region includes coupling a first terminal of the capacitor with the conductive routing region.

Example 18 may include the subject matter of Example 17, wherein the conductive routing region is a first conductive routing region, and the method further includes electrically coupling a second terminal of the capacitor with a second stiffener conductive routing region.

Example 19 may include the subject matter of any one of Examples 11-18, wherein the passive component is a first passive component, the stiffener conductive routing region is a first stiffener conductive routing region, and the method further comprises attaching one or more additional passive components to one or more additional stiffener conductive routing regions, wherein attaching the stiffener to the first side of the package substrate is also performed such that the one or more additional passive components are coupled with one or more IC die terminals via the one or more additional stiffener conductive routing regions.

Example 20 may include a computing device comprising: a circuit board; and an integrated circuit (IC) package assembly coupled with the circuit board, the IC package assembly including: a package substrate having a first side, a second side opposite the first side, and an outer edge extending between the first side and the second side; an IC die coupled with the first side of the package substrate, wherein the IC die includes a power terminal; a stiffener coupled with the first side of the package substrate, wherein the stiffener surrounds the IC die and includes a conductive routing region coupled with the IC die power terminal; and a passive electronic device coupled with the conductive routing region.

Example 21 may include the subject matter of Example 20, wherein the passive electronic device is a capacitor that includes a first terminal and a second terminal, the stiffener has a first side and a second side opposite the first side, the first side of the stiffener is coupled with the first side of the package substrate, the stiffener includes an overhang region where an edge of the stiffener extends beyond the package substrate outer edge, and the first terminal of the capacitor is coupled with the conductive routing region on the first side of the stiffener in the overhang region.

Example 22 may include the subject matter of Example 21, wherein the second terminal of the capacitor is coupled to the circuit board.

Example 23 may include the subject matter of Example 21, wherein the conductive routing region is a first conductive routing region, the stiffener includes a second conductive routing region electrically coupled with a ground terminal of the IC die, and the second terminal of the capacitor is coupled with the second conductive routing region on the first side of the stiffener in the overhang region.

Example 24 may include the subject matter of any one of Examples 20-23, wherein the stiffener includes a metal structure and a dielectric layer between the metal structure and the conductive routing region.

Example 25 may include the subject matter of any one of Examples 20-24, wherein the computing device is a mobile computing device including, coupled with the circuit board, a display, a touchscreen display, a touchscreen controller, a battery, a global positioning system device, a compass, a speaker, or a camera.

The invention claimed is:

1. An integrated circuit (IC) package assembly comprising:
   a package substrate having a first side, a second side opposite the first side, and an outer edge extending between the first side and the second side;
   an IC die coupled with the first side of the package substrate, wherein the IC die includes a power terminal;

a stiffener coupled with the first side of the package substrate, wherein the stiffener surrounds the IC die and includes a first conductive routing region coupled with the IC die power terminal, wherein the stiffener has a first side and a second side opposite the first side, wherein the first side of the stiffener is coupled with the first side of the package substrate and is entirely disposed in a plane that is above a plane of the first side of the package substrate, wherein the stiffener includes an overhang region that extends beyond the package substrate outer edge and is entirely disposed above the plane of the first side of the package substrate; and a passive electronic device coupled with the first conductive routing region and further coupled with the first side of the stiffener in the overhang region, wherein the passive electronic device is a capacitor that includes a first terminal and a second terminal, wherein the stiffener includes a second conductive routing region electrically coupled with a ground terminal of the IC die, and the second terminal of the capacitor is coupled with the second conductive routing region on the first side of the stiffener in the overhang region.

2. The IC package assembly of claim 1, wherein the first terminal of the capacitor is electrically coupled with the first conductive routing region.

3. The IC package assembly of claim 1, wherein the stiffener includes a metal structure and a dielectric layer between the metal structure and the first conductive routing region.

4. The IC package assembly of claim 3, wherein the first conductive routing region is formed of metal foil laminate or conductive ink.

5. The IC package assembly of claim 1, wherein the stiffener has a thickness less than a thickness of the IC die.

6. A computing device comprising:

a circuit board; and an integrated circuit (IC) package assembly coupled with the circuit board, the IC package assembly including:

a package substrate having a first side, a second side opposite the first side, and an outer edge extending between the first side and the second side;

an IC die coupled with the first side of the package substrate, wherein the IC die includes a power terminal;

a stiffener coupled with the first side of the package substrate, wherein the stiffener surrounds the IC die and includes a conductive routing region coupled with the IC die power terminal; and a passive electronic device coupled with the conductive routing region, wherein the passive electronic device is a capacitor that includes a first terminal and a second terminal, the stiffener has a first side and a second side opposite the first side, the first side of the stiffener is coupled with the first side of the package substrate, wherein the stiffener includes an overhang region where an edge of the stiffener extends beyond the package substrate outer edge, the first terminal of the capacitor is coupled with the conductive routing region on the first side of the stiffener in the overhang region, and the second terminal of the capacitor is coupled to the circuit board.

7. The computing device of claim 6, wherein the conductive routing region is a first conductive routing region, the stiffener includes a second conductive routing region electrically coupled with a ground terminal of the IC die, and the second terminal of the capacitor is coupled with the second conductive routing region on the first side of the stiffener in the overhang region.

8. The computing device of claim 6, wherein the stiffener includes a metal structure and a dielectric layer between the metal structure and the conductive routing region.

9. The computing device of claim 6, wherein the computing device is a mobile computing device including, coupled with the circuit board, a display, a touchscreen display, a touchscreen controller, a battery, a global positioning system device, a compass, a speaker, or a camera.

\* \* \* \* \*